United States Patent
de Stasi

(10) Patent No.: US 7,119,448 B1
(45) Date of Patent: Oct. 10, 2006

(54) MAIN POWER INDUCTANCE BASED ON BOND WIRES FOR A SWITCHING POWER CONVERTER

(75) Inventor: Frank J. de Stasi, San Leandro, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 80 days.

(21) Appl. No.: 10/968,662

(22) Filed: Oct. 18, 2004

(51) Int. Cl.
  *H01L 23/52* (2006.01)
  *H01L 23/48* (2006.01)
  *H01L 29/40* (2006.01)

(52) U.S. Cl. ............... 257/784; 257/697; 257/690; 257/691; 257/692; 438/106; 438/612

(58) Field of Classification Search ........ 257/690–692, 257/784, E23.141, E23.068, 697, 782, 666; 438/106, 612
See application file for complete search history.

(56) References Cited

U.S. PATENT DOCUMENTS

| | | | |
|---|---|---|---|
| 5,576,680 A * | 11/1996 | Ling ................ | 336/200 |
| 5,869,888 A * | 2/1999 | Tsubosaki et al. ........ | 257/692 |
| 5,986,345 A * | 11/1999 | Monnot .................. | 257/773 |
| 6,121,678 A * | 9/2000 | Chiu et al. ............... | 257/700 |
| 6,246,107 B1 * | 6/2001 | Silvestre ................. | 257/666 |
| 6,586,309 B1 | 7/2003 | Yeo et al. | |
| 6,661,083 B1 * | 12/2003 | Lee et al. ................ | 257/676 |
| 6,713,849 B1 * | 3/2004 | Hasebe et al. .......... | 257/667 |

OTHER PUBLICATIONS

O'Donnell et al, "Thin Film Micro-Transformers for Future Power Conversion," (2004) (pp. 939-944).

* cited by examiner

*Primary Examiner*—Kenneth Parker
*Assistant Examiner*—Chris C. Chu
(74) *Attorney, Agent, or Firm*—Darby & Darby PC; John W. Branch

(57) ABSTRACT

A method for providing main power inductance to a switching power supply using bond wires of an integrated circuit packaging. A predetermined number of bond wires are connected serially between standalone die bond pads and no-connect pins of the packaging. An output of the switching power supply is connected to a first bond wire, and an output pin of the integrated circuit is connected to a last bond wire. A number of the bond wires, a length and a diameter of each bond wire, and a distance of the bond wires from a die attach paddle may be pre-selected to determined the main power inductance.

17 Claims, 4 Drawing Sheets

MAIN POWER INDUCTANCE BASED ON BOND WIRES FOR A SWITCHING POWER CONVERTER

FIELD OF THE INVENTION

The present invention relates to switching power converters, and in particular, to a method for providing main power inductance to a switching power supply using bond wires of an integrated circuit packaging.

BACKGROUND

Integrated circuits may include millions of interconnected semiconductor devices such as transistors, as well as passive devices such as resistors. Only half a century after their development was initiated, integrated circuits have become ubiquitous. Computers, cellular phones, and many other digital devices are now inextricable part of the structure of modern societies. Integrated circuits may be fabricated in an almost two-dimensional bottom-up layer process that may include imaging, deposition, etching, and more.

A power supply is a buffer circuit that provides power with characteristics required by a load from a primary power source with characteristics incompatible with the load. The power supply essentially makes the load compatible with its power source. A switching-mode power supply is a power supply that provides the power supply function through low loss components such as capacitors, inductors, and transformers. Switching power supplies also employ switches that are in one of two states, on or off. The switches dissipate relatively little power in either of these two states and power conversion can be accomplished with minimal power loss, which equates to high efficiency. Switching power supplies may be provided on a single integrated circuit, combined with their load circuit, and the like.

Thus, it is with respect to these considerations and others that the present invention has been made.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description of the Invention, which is to be read in association with the accompanying drawings, wherein.

DETAILED DESCRIPTION

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment or an embodiment combining software and hardware aspects. The following detailed description is, therefore, not to be taken in a limiting sense.

Briefly stated, the present invention is directed to a method for providing main power inductance to a switching power supply using bond wires of an integrated circuit packaging. A predetermined number of bond wires are connected serially between standalone die bond pads and no-connect pins. An output of the switching power supply is connected to a first bond wire, and an output pin of the integrated circuit is connected to a last bond wire. The number of the bond wires, a length and a diameter of each bond wire, and a distance of the bond wires from a die attach paddle may be pre-selected to determined the main power inductance.

Figure 1:
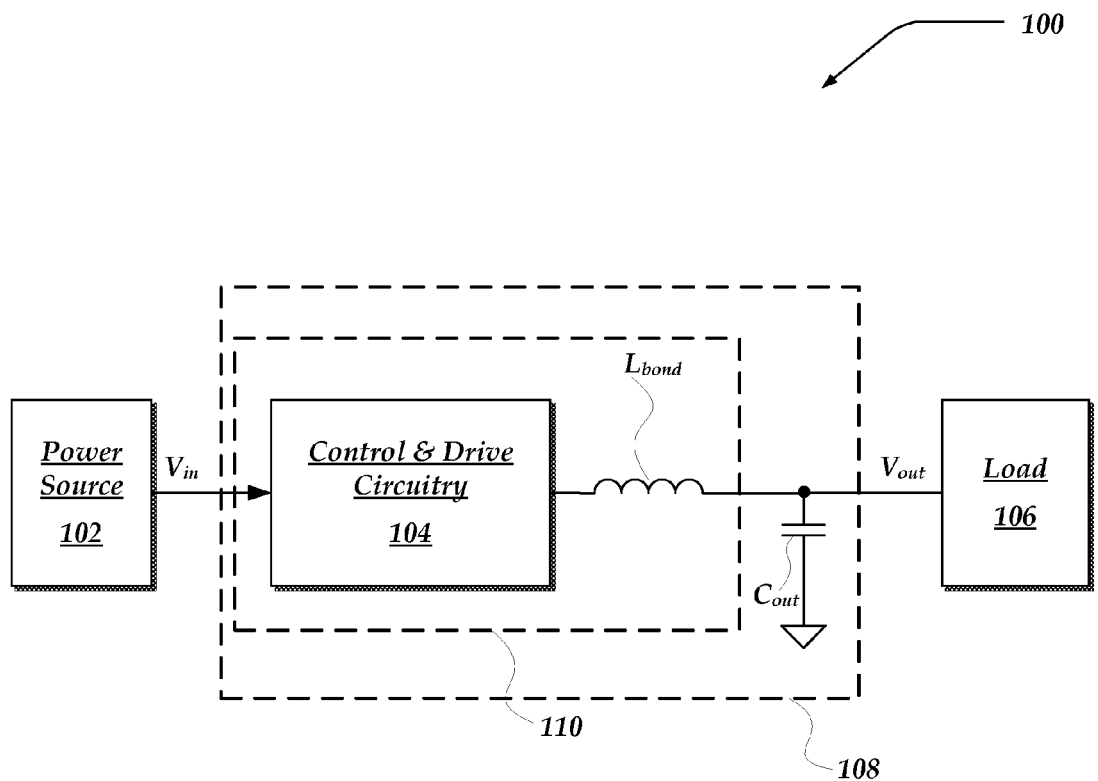
FIG. 1 is a block diagram illustrating an embodiment of a system, in which one embodiment of a main power inductance employing bond wires according to the present invention is implemented.

FIG. 1 shows a block diagram illustrating an embodiment of system 100, in which one embodiment of a main power inductance employing bond wires according to the present invention is implemented. System 100 includes power source 102, switching power supply 108 and load 106. Switching power supply 108 includes integrated circuit 110 and output capacitor $C_{out}$. Integrated circuit 110 includes control and drive circuitry 104 and bond wire inductance $L_{bond}$.

Power source 102 is arranged to provide supply voltage $V_{in}$ to switching power supply 108, which is configured to provide regulated voltage $V_{out}$ to load 106. Power source 102 may comprise any type of power source including, but not limited to, a battery, a voltage regulator, a current regulator, and the like. Load 106 may be a circuit within the same microchip, a circuit on another microchip, another device, and the like. In one embodiment, the circuitry of switching power supply 108 except for output capacitor $C_{out}$ may be implemented in an integrated circuit such as integrated circuit 110.

Integrated circuit packaging industry employs various package configurations. Each package type may support an integrated circuit chip or die, and provide protection from hostile environments and enable interconnections between the die and a printed circuit board. Generally, a lead frame may be a supporting structure of a molded integrated circuit package to which other elements are attached. The lead frame may be made from a thin metal strip by etching or stamping to form a pattern of leads around a die attach paddle. A die may be mounted upon an upper die support surface of the die attach paddle using a die attach material, which is typically an epoxy resin. The die may have a lower surface in contact with the die attach material and an opposing upper surface.

Electrical connections between the die circuitry and the leads may be provided by fine gold wires, which may be bonded to die bond pads on the die at the upper die surface and to wire bond surfaces on the leads of the lead frame using a wire bond technique. The lead frame, die, and wires may be covered with a thermoset plastic encapsulation or casing using transfer molding or another technique.

A non-leaded, molded integrated circuit package may also include a lead frame with a pattern of leads around a die attach paddle. A die, having lower and upper surfaces may be affixed to a die support surface on the die paddle using a die attach material. Fine gold wires may be bonded to die bond pads at the upper die surface and to wire bond surfaces on the leads by wire bonding. In this configuration, electrical connections between the die circuitry and the die paddle may be additionally provided by fine gold wire down bonds, which are bonded to die bond pads at the upper die surface and to down bond surfaces near a margin of the die paddle. The lead frame, die, and wires may again be covered with a plastic casing.

Switching power supply 108 is arranged to receive input voltage $V_{in}$ from power source 102 and to provide appropriate output voltage $V_{out}$ to load 106. Switching power supply 108 may include, among other circuits, a voltage sensing circuit, a current sensing circuit, a timing control circuit, a driver circuit, a switching circuit, and a feedback circuit that are implemented in integrated circuit 110. Various sub-circuits of switching power supply 108 are depicted in FIG. 1 as control and drive circuitry 104.

In one embodiment, switching power supply 108 may include an output inductor as part of its circuitry. If switching power supply 108 is manufactured on a microchip, bond wires as described above may provide connection between an output of switching power supply 108 and one or more pins of the microchip package. Bond wires and die bond pads may present an additional capacitance and inductance to switching power supply 108 as shown by $L_{bond}$ and $C_{out}$. In an embodiment of switching power supply 108 according to the present invention, the inductance $L_{bond}$ presented by the bond wires, which are serially coupled to each other along with die bond pads and package pins, may be utilized as an output inductance by switching power supply 108 instead of or in addition to a separate inductor component.

FIG. 1 shows a particular arrangement of inputs and outputs of the various components. Other arrangements of the components may be implemented without departing from the scope and spirit of the present invention.

Figure 2:
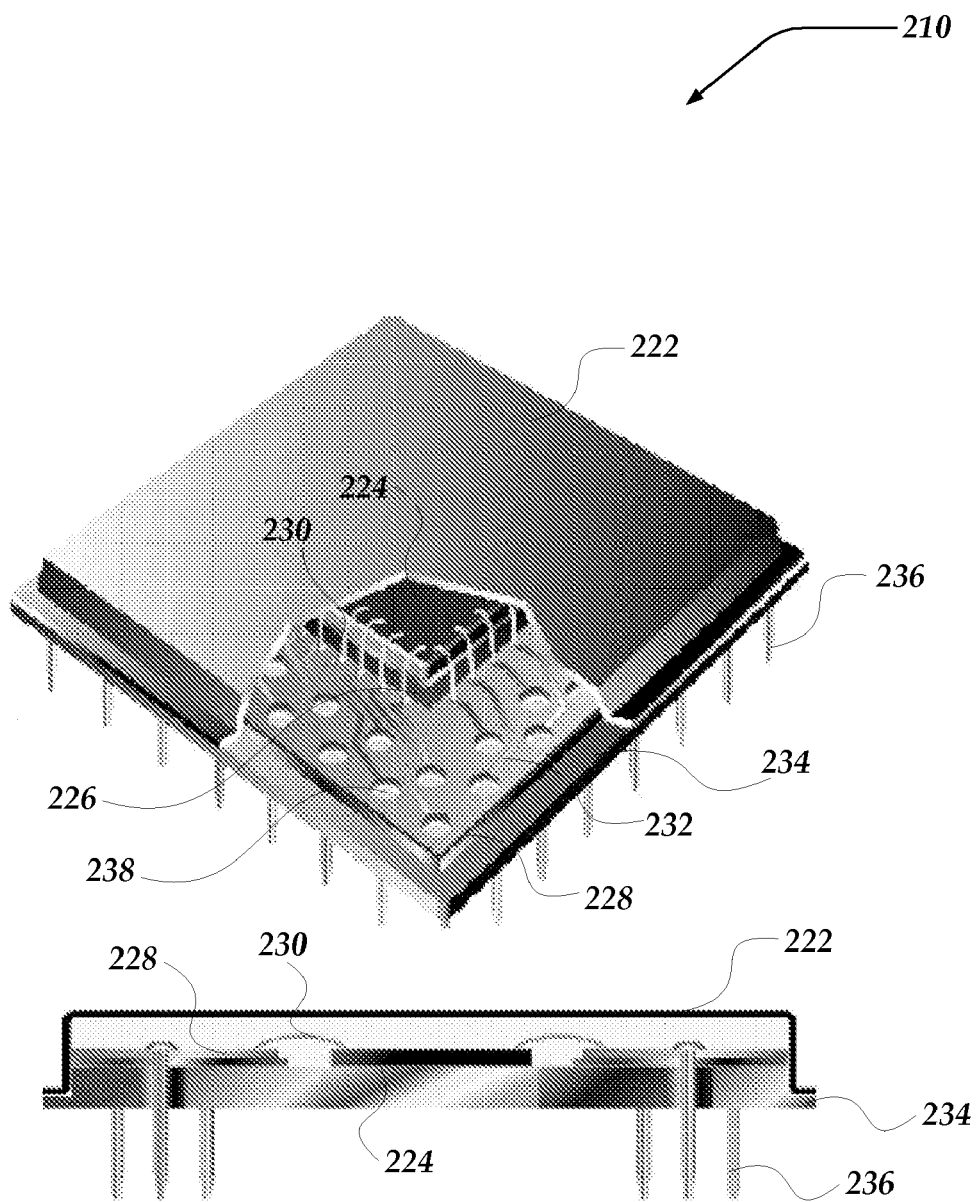
FIG. 2 illustrates an isometric view and a cross-sectional view of an embodiment of a microchip, which includes an embodiment of a main power inductance employing bond wires.

FIG. 2 illustrates an isometric view and a cross-sectional view of an embodiment of integrated circuit 210, which includes an embodiment of a main power inductance employing bond wires. Integrated circuit 210 may be employed as one embodiment of integrated circuit 110 of FIG. 1. Integrated circuit 210 includes chip casing 222, die 224, die attach paddle 226, lead frame 228, bond wires 230, pin connection traces 232, substrate 234, pins 236, and passivation openings 238.

Lead frame 228 is a supporting structure of integrated circuit 210 to which the other elements are attached. Lead frame 228 may be made from a thin metal strip by etching or stamping to form a pattern of pin connection traces 232 (also referred to as leads or top layer metal) around die attach paddle 226. Die 224 is mounted upon an "upper" die support surface of die attach paddle 226 using a die attach material, which is typically an epoxy resin. Die 224 has a "lower" surface in contact with die attach paddle 226 and an opposing "upper" surface. Electrical connections between die circuitry and pin connection traces 232 are provided by bond wires 230, which are bonded to die bond pads on die 224 at the upper die surface and to wire bond surfaces on pin connection traces 232 of lead frame 228 using a wire bond technique. Lead frame 228, die 224 and bond wires 230 are covered with casing 222. Casing 222 may be manufactured employing thermoset plastic encapsulation, ceramic encapsulation, and the like.

Substrate 234, on which lead frame 228 and die attach paddle 226 rest, includes passivation openings 238. Pins 236 are coupled to pin connection traces 232 at passivation openings 238. Die 224 may be manufactured employing a single-crystal silicon wafer, a silicon-on-sapphire wafer, a gallium-arsenide wafer, and the like. Photolitography may be used to mark different areas of die 224 to be doped or to have metal tracks (such as aluminum) traces sputtered on.

In addition to intentionally manufactured components within die 224, such as transistors, resistors, capacitors, and the like, elements of the microchip, such as bond wires 230, pin connection traces 232 may present additional resistance, inductance, and/or capacitance to the circuitry. Generally such inductance, capacitance, and resistance may be considered parasitic and minimized or compensated for. In some cases, however, electrical characteristics of the elements of integrated circuit 210 may be used to an advantage of the circuitry.

According to one embodiment of the invention, inductance provided by bond wires 230 may be controlled in such a way that a predetermined value is incorporated into the microchip design and the inductance of bond wires 230 is used in place of or in conjunction with an output inductor of a switching power supply.

FIG. 2 shows a particular arrangement of various elements of integrated circuit 210. Other arrangements of the elements may be implemented without departing from the scope and spirit of the present invention.

Figure 3:
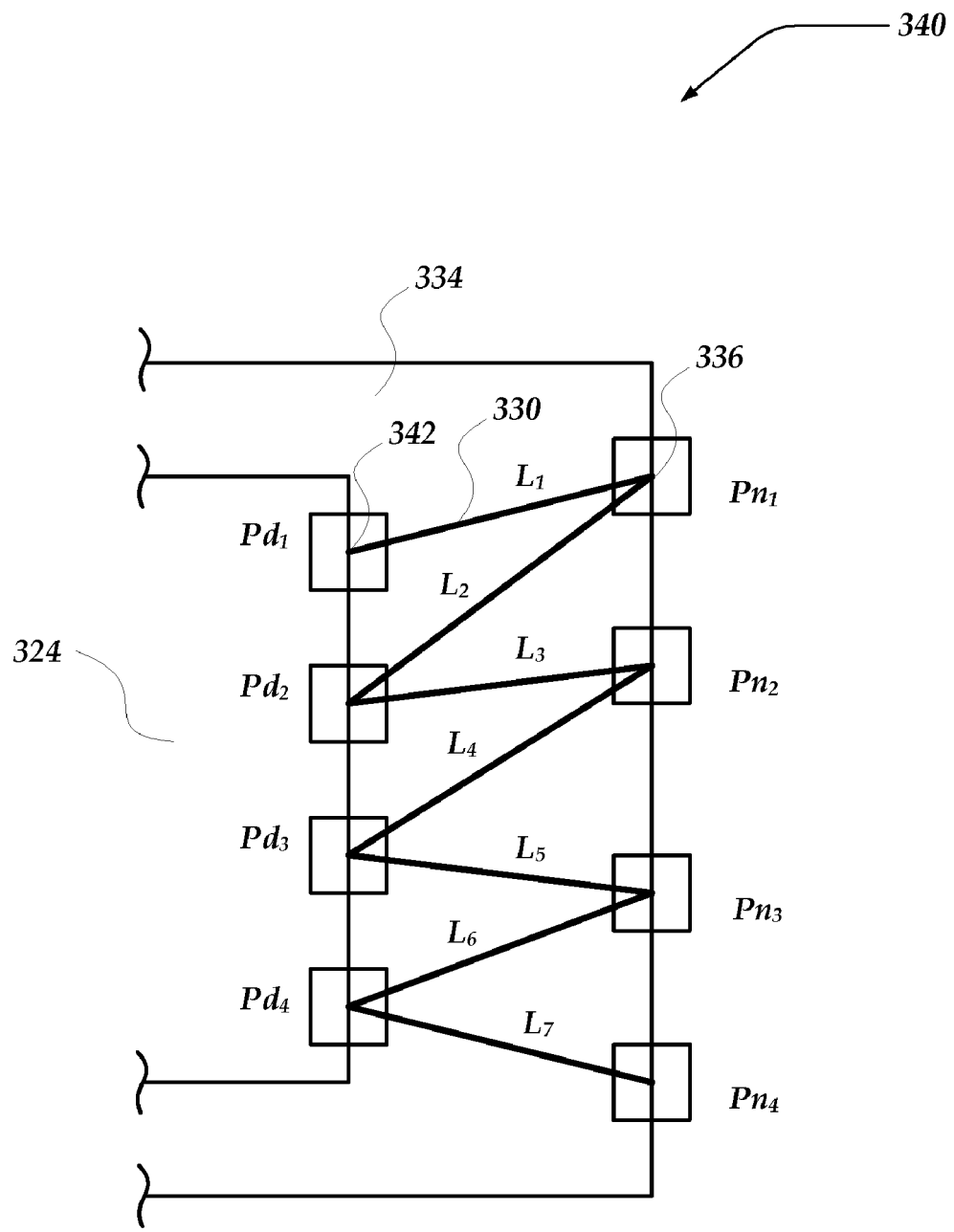
FIG. 3 illustrates a partial top view of an embodiment of the microchip of FIG. 2.

FIG. 3 illustrates a top view of portion 340 of an embodiment of integrated circuit 210 of FIG. 2, which includes an embodiment of bond wires employed as inductance. Portion 340 of an embodiment of integrated circuit 210 includes die 324, substrate 334, die bond pads 342 ($Pd_1$–$Pd_4$), bond wires 330 ($L_1$–$L_7$), and pins 336 ($Pn_1$–$Pn_4$). While portion 340 shows four die bond pads 342 and four pins 336, other combinations of at least two die bond pads and at least one package pin along with corresponding number of bond wires may be implemented without departing from the scope and spirit of the invention. Indeed, the number of die bond pads, package pins, and bond wires may be selected for a predetermined inductance.

As mentioned previously, most magnetic based and monolithic power converters such as switching power supplies include an output stage inductor. This inductor may be implemented on-chip or off-chip in either case adding to a cost of the power supply. Bond wires, as explained above, present a parasitic inductance to a circuitry of the microchip. The inductance L of a bond wire in a microchip may be expressed as:

$$L \approx l * \frac{\mu_0}{2\pi} * \ln\left(\frac{2H}{a}\right), \tag{1}$$

where $\mu_0$ is permeability constant of space;

l is a length of the bond wire;

H is a distance of the bond wire from the die attach paddle; and a is a diameter of the bond wire.

According to one embodiment of the present invention, a number of bond wires are coupled in series with each other between an output of the switching power supply circuit and an output pin of integrated circuit 210. FIG. 3 illustrates a four die bond pad—four pin example of such an implementation. The output of the switching power supply may be connected to die bond pad $Pd_1$. Bond wires $L_1$–$L_7$ may be coupled in series with each other using die bond pads $Pd_1$–$Pd_4$, which yields a total inductance of $L_{total}$. Employing equation (1), total inductance may be expressed as $$L_{total} = 7*L \approx 7*1*\frac{\mu_0}{2\pi}*\ln\left(\frac{2H}{a}\right).$$

Because die bond pads $Pd_2$–$Pd_4$ and pins $Pn_1$–$Pn_3$ are used to serially connect bond wires $L_1$–$L_7$, and not for any other circuit connection purposes, an area under die bond pads $Pd_2$–$Pd_4$ may be used for other circuitry and present no die area penalty due to extra die bond pads. Pins $Pn_1$–$Pn_3$ may be designated as no-connect pins. Accordingly, die bond pads $Pd_2$–$Pd_4$ may be manufactured with top layer metal and passivation openings, only. Last pin $Pn_4$ may be used as output pin of integrated circuit 210 providing an output signal of the switching power supply.

Consequently, a predetermined output inductor may be provided to the switching power supply without modifying an existing die or packaging process and saving additional component or die area by eliminating an extra inductor component. In another embodiment, the inductance provided by the bond wires may be employed in conjunction with an existing output inductor supplementing the total inductance. Because the inductance is obtained without a coil inductor, magnetic saturation effects may be non-existent or minimal.

For commonly available integrated circuit packages, inductances ranging from about 1 nH to about 10 nH may be obtained with reasonable number of bond wires. This range of inductances is appropriate for switching power supplies operating at or above 10 MHz. If higher inductance values are needed, a total length, thereby the total inductance, may be increased by manufacturing integrated circuit 210 with an offset for die 324.

FIG. 3 shows a particular arrangement of the pads, bond wires, and pins. These components of the integrated circuit may be arranged in other ways without departing from the scope and spirit of the invention.

Figure 4:
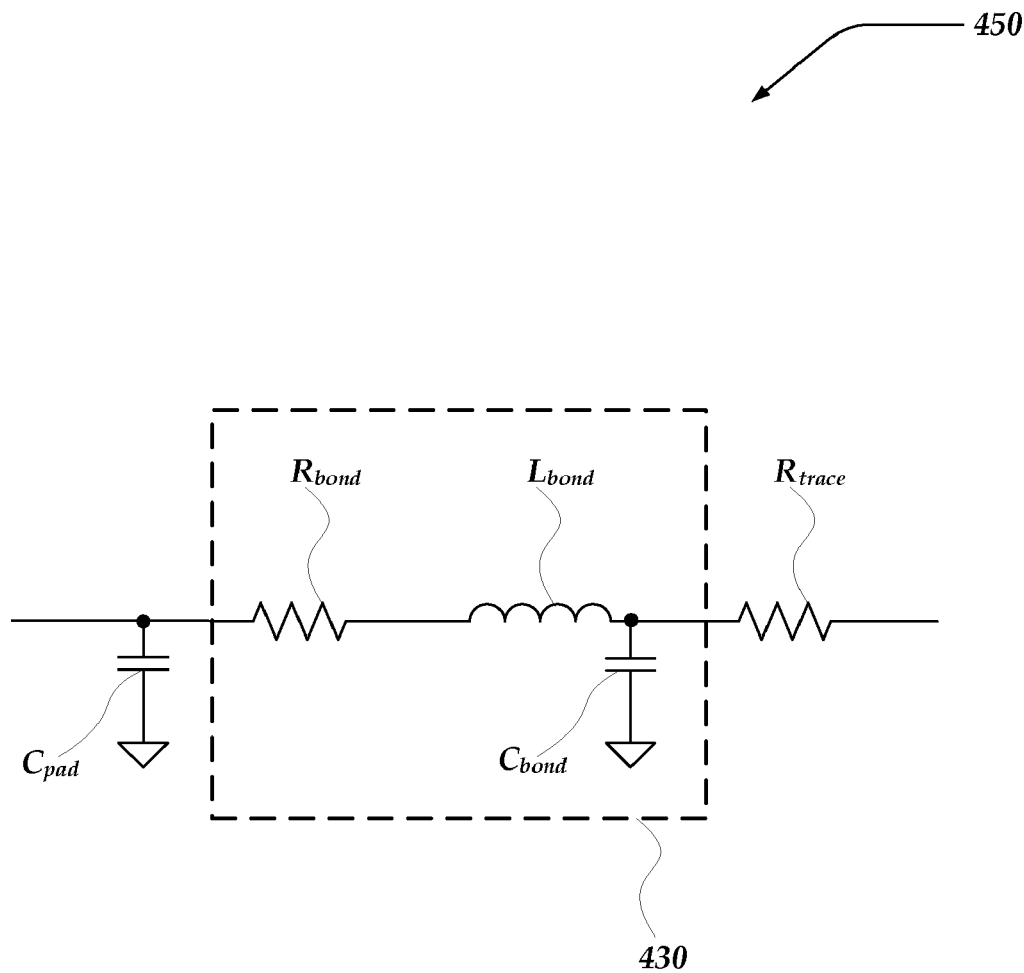
FIG. 4 schematically illustrates a circuit model of a die-pin connection in a microchip.

FIG. 4 schematically illustrates circuit-model 450 of a die-pin connection in a microchip such as integrated circuit 210 of FIG. 2.

A bond wire such as bond wire 330 of FIG. 3 may be electrically modeled as RLC circuit 430 comprising serially coupled resistor $R_{bond}$ and inductor $L_{bond}$, and a capacitor $C_{bond}$ between a ground and $L_{bond}$ representing parasitic capacitance. In addition to RLC circuit 430, parasitic capacitance of the die bond pad $C_{pad}$ and resistance of pin connection trace $R_{trace}$ may also be included in the circuit model of die-pin connection in the microchip.

$R_{bond}$ may be controlled by pre-selecting a material, a diameter, a length of the bond wires. Similarly, $R_{trace}$ may be controlled by pre-selecting a material, a thickness, a width, a length, and a spacing from a ground plane of the pin connection traces.

In one embodiment, parasitic capacitances $C_{pad}$ and $C_{bond}$ may be unwanted, and are minimized by pre-selecting the dimensions, a spacing from the ground plane of the pads and bond wires, as well as the substrate material.

Inductance of the bond wires $L_{bond}$ may be utilized, as described above, to replace or supplement an output inductance of a switching power supply. A value of $L_{bond}$ may be determined by pre-selecting a diameter, a length, and a distance of the bond wire from die attach paddle.

While embodiments of the present invention are described in conjunction with a switching power converter, the present invention is not so limited. Indeed, the described inductor based on bond wires of a microchip may be implemented in any integrated circuit with an output inductor. For example, linear regulator circuits may employ the bond wires as described above for an output inductor. The above specification, examples and data provide a description of the manufacture and use of the composition of the invention. Since many embodiments of the invention can be made without departing from the spirit and scope of the invention, the invention also resides in the claims hereinafter appended.

We claim:

1. An inductor for an integrated circuit, comprising a first inductive element, wherein the first inductive element comprises:
   a first die bond pad and a second die bond pad;
   a first package pin and a second package pin;
   a first bond wire that is coupled between the first die bond pad and the first package pin;
   a second bond wire that is coupled between the first package pin and the second die bond pad; and
   a third bond wire that is coupled between the second die bond pad and the second package pin, wherein an output of a circuit included in the integrated circuit is coupled to the first die bond pad.

2. The inductor of claim 1, wherein the second package pin of the first inductive element is arranged to provide an output of the integrated circuit, and wherein the first package pin of the first inductive element is a no-connect pin.

3. The inductor of claim 1, wherein the second die bond pad of the first inductive element comprises top layer metal and a passivation opening, and a portion of the integrated circuit is positioned in layers underneath the second die bond pad.

4. The inductor of claim 1, further comprising:
   a third die bond pad;
   a third package pin;
   a fourth bond wire that is coupled between the second package pin and the third die bond pad; and
   a fifth bond wire that is coupled between the third die bond pad and the third package pin, wherein the third package pin is arranged to provide an output of the integrated circuit, and wherein the first and the second package pins are a no-connect pins.

5. The inductor of claim 1, further comprising a second inductive element and a fourth bond wire that are arranged such that:
   the second inductive element is constructed substantially the same way as the first inductive element and includes:
   a third die bond pad and a fourth die bond pad;
   a third package pin and a fourth package pin;
   a fifth bond wire that is coupled between the third die bond pad and the third package pin;
   a sixth bond wire that is coupled between the third package pin and the fourth die bond pad; and
   a seventh bond wire that is coupled between the fourth die bond pad and the fourth package pin, wherein an output of the circuit included in the integrated circuit is coupled to the first die bond pad; and the second inductive element is coupled to the first inductive element by the fourth bond wire that is coupled between the second package pin and the third die bond pad.

6. The inductor of claim 5, wherein the fourth package pin is arranged to provide an output of the integrated circuit, and wherein the first, the second, and the third package pins are no-connect pins.

7. The inductor of claim 5, wherein the second, the third, and the fourth die bond pads comprise top layer metal and a passivation opening, and a portion of the integrated circuit is positioned in layers underneath the second, the third, and the fourth die bond pads.

8. The inductor of claim 5, further comprising at least one additional inductive element such that:
  each additional inductive element is constructed substantially the same way as the first inductive element; and
  each additional inductive element is coupled to a preceding inductive element by an additional bond wire that is coupled between a last package pin of the preceding inductive element and a first die bond pad of the additional inductive element.

9. The inductor of claim 8, wherein the inductor is employed as at least one of an input inductor and an output inductor.

10. The inductor of claim 8, wherein a length, a diameter, and a distance from a die paddle of each bond wire of the inductive elements is pre-selected such that a total inductance of the inductive elements has a predetermined value.

11. The inductor of claim 8, wherein a total number of the inductive elements is pre-selected such that the total inductance of the inductive elements has a predetermined value.

12. The inductor of claim 8, wherein a length, a diameter, and the distance from a die paddle of each bond wire, and a total number of the bond wires of the inductive elements are pre-selected such that the total inductance of the inductor is between about 1 nanohenry and about 10 nanohenry.

13. The inductor of claim 1, wherein the integrated circuit includes at least one of a switching power regulator circuit and a linear power regulator circuit.

14. An integrated power supply circuit on a chip, comprising:
  a first inductive element; and
  a power regulator subcircuit that is arranged to provide an output to the first inductive element on the chip, wherein the first inductive element comprises:
    a first die bond pad and a second die bond pad;
    a first package pin and a second package pin;
    a first bond wire that is coupled between the first die bond pad and the first package pin;
    a second bond wire that is coupled between the first package pin and the second die bond pad; and
    a third bond wire that is coupled between the second die bond pad and the second package pin, wherein the output of the power regulator subcircuit is coupled to the first die bond pad, and wherein the second package pin of the first inductive element is arranged to provide an output of the integrated power supply circuit.

15. The circuit of claim 14, further comprising a second inductive element and a fourth bond wire that are arranged such that:
  the second inductive element is constructed substantially the same way as the first inductive element and includes:
    a third die bond pad and a fourth die bond pad;
    a third package pin and a fourth package pin;
    a fifth bond wire that is coupled between the third die bond pad and the third package pin;
    a sixth bond wire that is coupled between the third package pin and the fourth die bond pad; and
    a seventh bond wire that is coupled between the fourth die bond pad and the fourth package pin, wherein the output of the power regulator subcircuit is coupled to the first die bond pad and the fourth package pin of the second inductive element is arranged to provide the output of the integrated power supply circuit; and
  the second inductive element is coupled to the first inductive element by the fourth bond wire that is coupled between the second package pin and the third die bond pad.

16. The circuit of claim 15, further comprising at least one additional inductive element such that:
  each additional inductive element is constructed substantially the same way as the first inductive element; and
  each additional inductive element is coupled to a preceding inductive element by an additional bond wire that is coupled between a last package pin of the preceding inductive element and a first die bond pad of the additional inductive element.

17. The circuit of claim 16, wherein a length, a diameter, and a distance from a die paddle of each bond wire of the inductive elements, and a total number of the inductive elements is pre-selected such that a total inductance of the inductive elements has a predetermined value.

* * * * *

UNITED STATES PATENT AND TRADEMARK OFFICE
CERTIFICATE OF CORRECTION

PATENT NO.        : 7,119,448 B1                                Page 1 of 1
APPLICATION NO. : 10/968662
DATED             : October 10, 2006
INVENTOR(S)       : Frank J. DeStasi It is certified that error appears in the above-identified patent and that said Letters Patent is hereby corrected as shown below:

Title Page, Col. 1 (Inventor); Line 1; Delete "de Stasi," and insert -- DeStasi, --, therefor.

Column 4; Line 6; Delete "Photolitography" and insert -- Photolithography --, therefor.

Column 4, Line 53 (Approx.); Delete "L ≈I" ad insert -- L ≈l --, therefor.

Signed and Sealed this

Third Day of April, 2007

JON W. DUDAS
*Director of the United States Patent and Trademark Office*